(12) United States Patent
Goishi

(10) Patent No.: US 7,363,566 B2
(45) Date of Patent: Apr. 22, 2008

(54) PATTERN GENERATOR AND TEST APPARATUS

(75) Inventor: Masaru Goishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 373 days.

(21) Appl. No.: 11/136,075

(22) Filed: May 24, 2005

(65) Prior Publication Data

US 2006/0271832 A1 Nov. 30, 2006

(51) Int. Cl.
*G06F 11/00* (2006.01)

(52) U.S. Cl. .................................... 714/738

(58) Field of Classification Search ............... 714/743, 714/738, 739, 724
See application file for complete search history.

(56) References Cited

U.S. PATENT DOCUMENTS 4,905,183 A * 2/1990 Kawaguchi et al. .......... 712/19

6,215,324 B1 * 4/2001 Yoshida ...................... 324/760

* cited by examiner

*Primary Examiner*—Jacques Louis-Jacques
*Assistant Examiner*—Esaw Abraham
(74) *Attorney, Agent, or Firm*—Osha Liang LLP

(57) ABSTRACT

There is provided a pattern generator that generates a test pattern for testing an electronic device using test data previously supplied. The pattern generator includes a cache memory, a main memory operable to store a plurality of test data blocks of which each block is the test data of the magnitude capable of being stored on the cache memory, and an instruction memory operable to store instruction information showing sequence in which the plurality of test data blocks should be stored on the cache memory, in which the pattern generator sequentially outputs the test data blocks stored on the cache memory as the test pattern. It is preferable that the instruction memory stores the instruction information showing all sequence of the test data blocks to be stored on the cache memory in order to generate the test pattern before beginning to generate the test pattern.

10 Claims, 5 Drawing Sheets

|  | MAIN TEST DATA BLOCK | SUB TEST DATA BLOCK |
|---|---|---|
| TEST PATTERN 1 | TEST DATA BLOCK A<br><br>TEST DATA BLOCK C | TEST DATA BLOCK B<br><br>TEST DATA BLOCK B |
| TEST PATTERN 2 | TEST DATA BLOCK A | TEST DATA BLOCK B<br>TEST DATA BLOCK B |
| TEST PATTERN 3 | TEST DATA BLOCK C<br><br>TEST DATA BLOCK C | TEST DATA BLOCK B<br>TEST DATA BLOCK D |

*FIG. 5*

PATTERN GENERATOR AND TEST APPARATUS

BACKGROUND OF THE INVENTION

1. Field of the Invention

The present invention relates to a pattern generator and a testing device. More particularly, the present invention relates to a pattern generator and a testing device for testing an electronic device. The present application also relates to the following application, the contents of which are incorporated herein by reference if applicable.

a Japanese Patent Application No. 2004-64406 Filed on Mar. 8, 2004.

2. Description of Related Art

Conventionally, a pattern generator is used in a testing device testing an electronic device. The pattern generator generates a test pattern for testing the electronic device, which is a signal input to the electronic device. A conventional pattern generator generates a test pattern using pattern data and sequence data.

The pattern generator includes a memory storing a pattern data group and a sequence data group and a cache memory storing pattern data and sequence data. The sequence data is an instruction group indicating output sequence of pattern data to generate the test pattern, and includes a jump instruction, a loop instruction, etc.

The pattern generator reads pattern data and sequence data from a memory, and stores these data on a cache memory. Moreover, the test pattern is generated using the pattern data stored on the cache memory according to the instruction group of the sequence data stored on the cache memory.

When detecting an instruction to jump to an address of the pattern data that is not stored on the cache memory in the instruction group of sequence data, the pattern generator reads the pattern data according to that address from the memory and stores the data on the cache memory. For this reason, the sequence data instructions cannot consecutively be executed by the processing speed of the pattern generator, the size of the pattern data, etc. and thus waiting time occurs in some cases. Therefore, it was difficult to efficiently generate the test pattern. Moreover, although a pattern generator detects a jump instruction, etc. from sequence data and prefetches the corresponding pattern data, the similar problem occurs. Moreover, in the testing device with the use of such a pattern generator, it was difficult to efficiently test the electronic device.

Therefore, it is an object of the present invention to provide an ink cartridge and an ink cartridge holder that can solve the foregoing problems. The above and other objects can be achieved by combinations described in the independent claims. The dependent claims define further advantageous and exemplary combinations of the present invention.

SUMMARY OF THE INVENTION

To solve this problem, according to the first aspect of the present invention, there is provided a pattern generator that generates a test pattern for testing an electronic device using test data previously supplied. The pattern generator includes: a cache memory; a main memory operable to store a plurality of test data blocks of which each block is the test data of the magnitude capable of being stored on the cache memory; and an instruction memory operable to store instruction information showing sequence in which the plurality of test data blocks should be stored on the cache memory, in which the pattern generator sequentially outputs the test data blocks stored on the cache memory as the test pattern.

The instruction memory may store the instruction information showing all sequence of the test data blocks to be stored on the cache memory in order to generate the test pattern before beginning to generate the test pattern. The cache memory may have a predetermined plurality of storage areas, and the pattern generator may further include a memory control unit operable to control which storage area in the cache memory the test data block to be stored on the cache memory is stored on.

Therefore, it is an object of the present invention to provide pattern generator and a testing device that can solve the foregoing problems. The above and other objects can be achieved by combinations described in the independent claims. The dependent claims define further advantageous and exemplary combinations of the present invention.

The test pattern may include: a pattern data showing a signal to be supplied to the electronic device; and a sequence data showing sequence in which the test data pattern should be supplied to the electronic device, the cache memory may include: a pattern cache memory that stores the pattern data; and a sequence cache memory that stores the sequence data.

The pattern generator may further include: a pattern generating unit operable to sequentially take out the pattern data from the cache memory; and a sequencer operable to sequentially take out the sequence data from the cache memory, and the pattern generating unit may generate the test pattern based on the pattern data taken out and the sequence data taken out by the sequencer.

According to the second aspect of the present invention, there is provided a testing device that tests an electronic device. The testing device includes: a pattern generator operable to generate a test pattern for testing the electronic device using test data previously supplied; a wave form shaper operable to shape the test pattern; and a deciding unit operable to decide the quality of the electronic device based on an output signal output from the electronic device according to the test pattern, in which the pattern generator includes: a cache memory; a main memory that stores a plurality of test data blocks of which each block is the test data of the magnitude capable of being stored on the cache memory; and an instruction memory that stores instruction information showing sequence in which the plurality of test data blocks should be stored on the cache memory, and the pattern generator sequentially outputs the test data blocks stored on the cache memory as the test pattern.

The deciding unit may decide the quality of the electronic device in correspondence with each of the test data blocks, and the pattern generator may further include a decision result memory that stores a decision result from the deciding unit in association with the test data block. The testing device may further include a data adding unit operable to write the new test data block on the main memory, and the data adding unit may write the test data block indicated by the instruction information on the main memory when the test data block not stored on the main memory is indicated by the instruction information.

The summary of the invention does not necessarily describe all necessary features of the present invention. The present invention may also be a sub-combination of the features described above.

BRIEF DESCRIPTION OF THE DRAWINGS

FIG. 5 is a view exemplary showing the test pattern being generated by the pattern generator.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
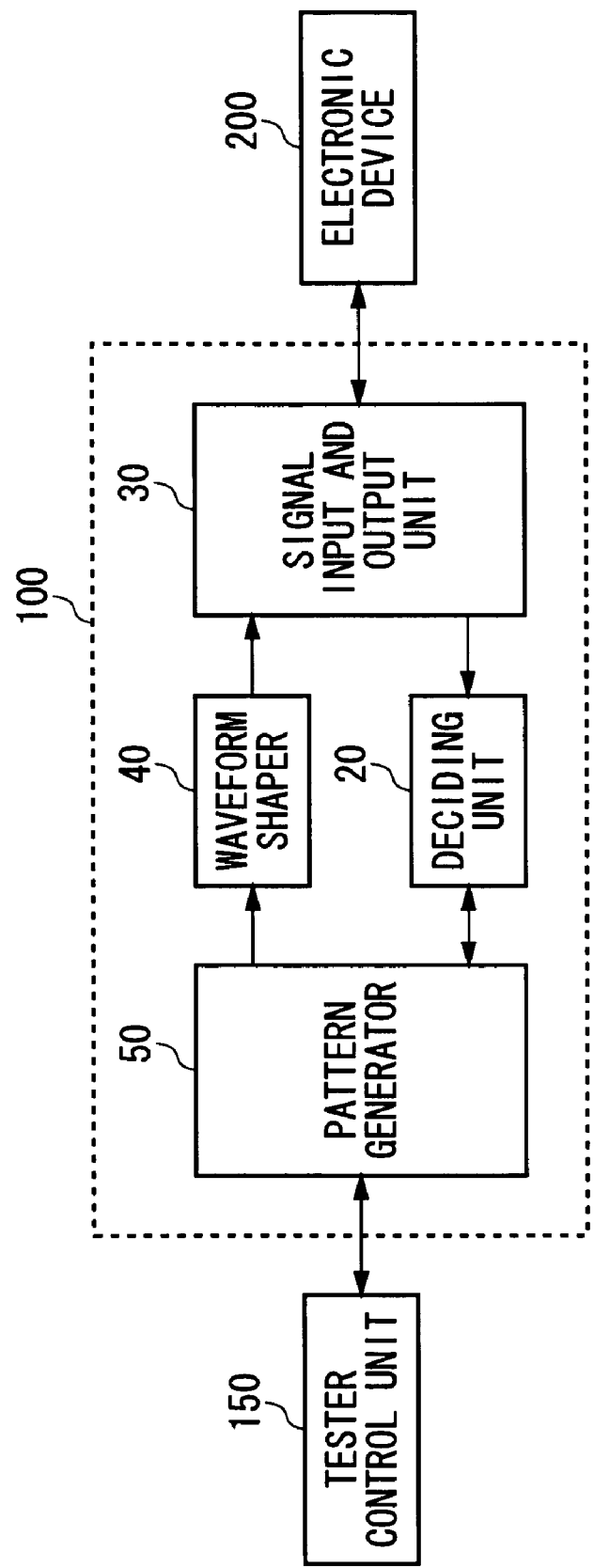
FIG. 1 is a view exemplary showing a configuration of a testing device according to an embodiment of the present invention.

FIG. 1 is a view exemplary showing a configuration of a testing device 100 according to an embodiment of the present invention. The testing device 100 tests the electronic device 200. The testing device 100 includes a pattern generator 50, a waveform shaper 40, a signal input and output unit 30, and a deciding unit 20.

The pattern generator 50 receives test data that are used for testing the electronic device 200 from a tester control unit 150 provided outside, and generates a test pattern for testing the electronic device 200 based on the test data. The tester control unit 150 is a computer such as a workstation. Moreover, the pattern generator 50 may generate an expected value signal showing an expected value to be output from the electronic device 200 based on the input test pattern.

The waveform shaper 40 receives and shapes the test pattern. Moreover, the waveform shaper 40 supplies the test pattern received at the desired timing to the signal input and output unit 30.

The signal input and output unit 30 supplies the received test pattern to the electronic device 200, and receives an output signal output from the electronic device 200 based on the test pattern. Moreover, the signal input and output unit 30 supplies the received output signal to the deciding unit 20.

The deciding unit 20 decides the quality of the electronic device 200 based on the received output signal. For example, the deciding unit 20 receives the expected value signal from the pattern generator 50, and decides the quality of the electronic device 200 by comparing the expected value signal and the output signal of the electronic device 200.

Figure 2:
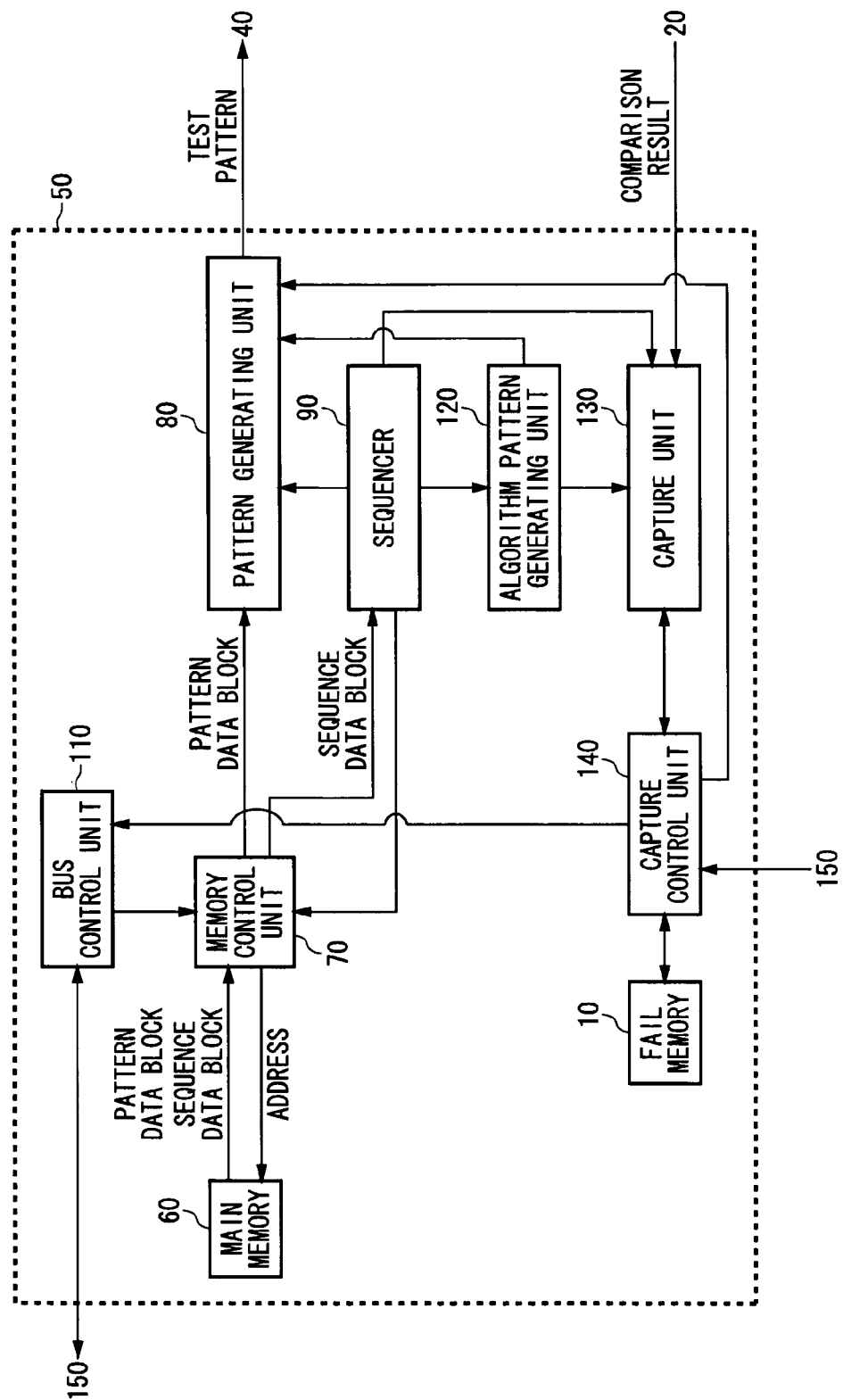
FIG. 2 is a view exemplary showing a configuration of a pattern generator.

FIG. 2 is a view exemplary showing a configuration of the pattern generator 50. The pattern generator 50 includes a main memory 60, a memory control unit 70, a pattern generating unit 80, a sequencer 90, a bus control unit 110, an algorithm pattern generating unit 120, a capture unit 130, a capture control unit 140, and a fail memory 10.

The main memory 60 stores the test data for generating the test pattern. The test data are divided into a plurality of test data blocks and then are stored. For example, the main memory 60 stores a plurality of pattern data blocks that is made by dividing the pattern data showing the signal to be supplied to the electronic device 200 and sequence data blocks that are made by dividing the sequence data to indicate sequence in which the pattern data should be supplied to the electronic device 200, as a test data block. Moreover, the main memory 60 stores the pattern data blocks and the sequence data blocks in association with each other.

The bus control unit 110 receives instruction information showing sequence in which the test data blocks should be supplied to the pattern generating unit 80 and/or the sequencer 90 from the tester control unit 150, and sequentially instructs the memory control unit 70 on which pattern data block and/or sequence data block are/is read from the main memory 60 according to the instruction information. The memory control unit 70 sequentially reads the pattern data block and the sequence data block from the main memory 60 based on the instruction received from the bus control unit 110, and sequentially supplies the read pattern data blocks to the pattern generating unit 80 and sequentially supplies the read sequence data blocks to the sequencer 90.

The pattern generation unit 80 sequentially receives the pattern data blocks, and generates the test pattern based on the pattern data blocks. The sequencer 90 sequentially stores the received sequence data blocks, and controls the pattern generating unit 80 based on the stored sequence data blocks. For example, the sequence data block is a program for indicating sequence in which data in the pattern data block should be output and generating the test pattern. The pattern generating unit 80 generates the test pattern according to the program. The sequencer 90 may sequentially instruct the pattern generating unit 80 on addresses of the pattern data blocks to be output from the pattern generating unit 80 based on the sequence data blocks.

Moreover, when an electronic device 200 under test is a memory, the sequencer 90 may supply an instruction signal to indicate the generation of pattern data for a memory test to the algorithm pattern generating unit 120. When receiving the instruction signal, the algorithm pattern generating unit 120 generates the pattern data for a memory test based on a preset algorithm. In this case, the pattern generating unit 80 generates a test pattern based on the pattern data for a memory test.

The capture unit 130 and the capture control unit 140 store a decision result from the deciding unit 20 on the fail memory 10. The capture unit 130 receives either or both of the address of the pattern data block, which is indicated by the sequencer 90 to the pattern generating unit 80, and the data for a memory test, which is generated from the algorithm pattern generating unit 120. The capture unit 130 adds either or both of the address of the corresponding pattern data block and the corresponding data for a memory test to the decision result. The capture control unit 140 receives the instruction signal showing whether the decision result should be stored on the fail memory 10 from the tester control unit 150, and supplies the decision result to the fail memory 10 according to the instruction signal.

Moreover, when a test by one pattern data block has been finished, the capture control unit 140 may inform the bus control unit 110 of the decision result for the pattern data block. In this case, the bus control unit 110 informs the tester control unit 150 of the decision result.

Moreover, the fail memory 10 stores the decision result from the deciding unit 20. The tester control unit 150 may read the decision result stored on the fail memory 10 to analyze the test result of the electronic device 200, or may analyze the test result based on the decision result for each pattern data block. Moreover, in this example, the pattern generator 50 has the fail memory 10. However, in another example, the pattern generator 50 does not have the fail memory 10, but the testing device 100 may have the fail memory 10 or the tester control unit 150 may have the fail memory 10.

Figure 3:
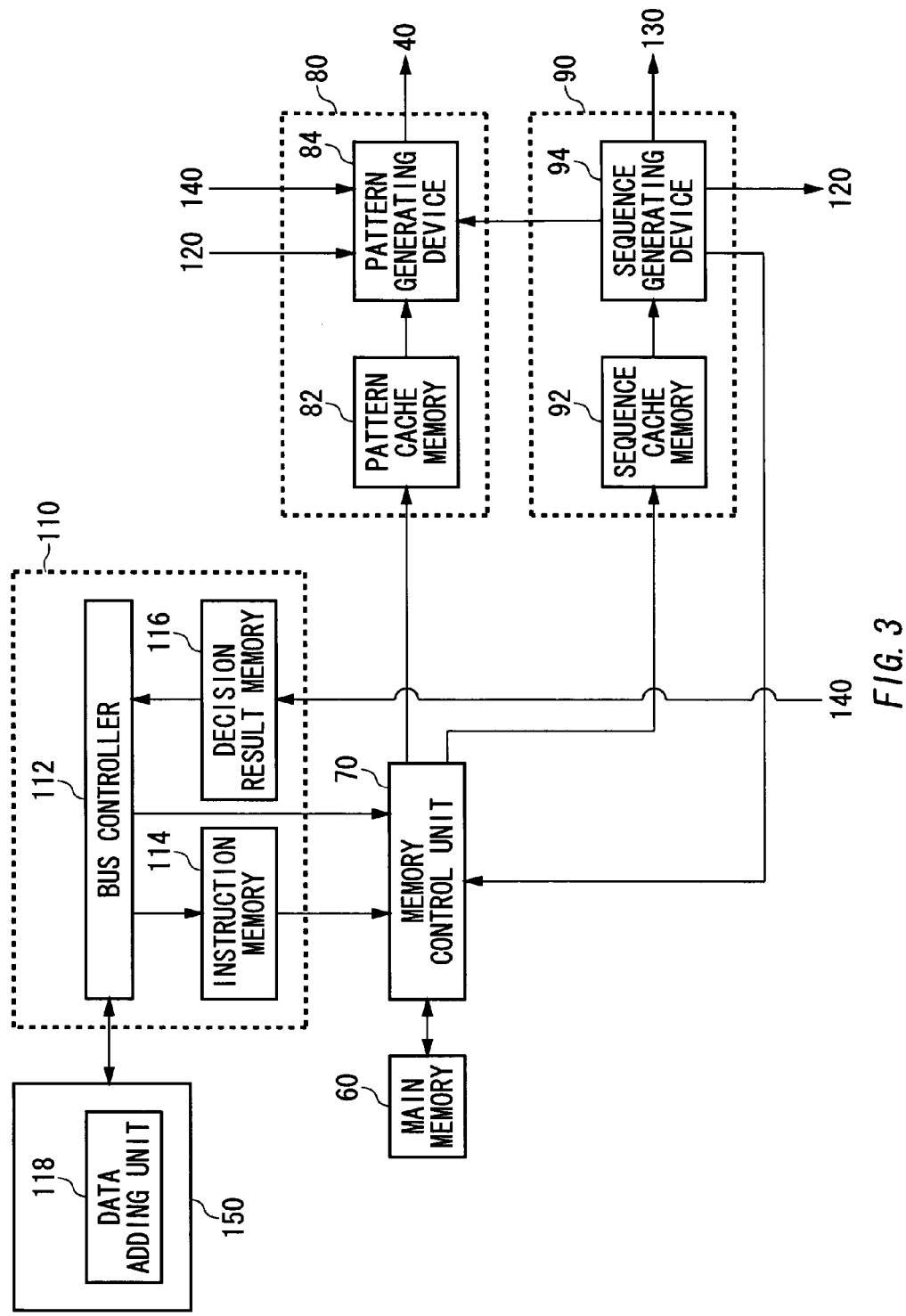
FIG. 3 is a view exemplary showing a detailed configuration of a bus control unit, a pattern generating unit, and a sequencer.

FIG. 3 is a view exemplary showing a detailed configuration of the bus control unit 110, the pattern generating unit 80, and the sequencer 90. The bus control unit 110 has a bus controller 112, an instruction memory 114, and a decision result memory 116. Moreover, the pattern generating unit 80 has a pattern cache memory 82 and the pattern generating device 84, and the sequencer 90 has a sequence cache memory 92 and a sequence generating device 94.

The bus controller 112 receives the instruction information from the tester control unit 150 and stores the information on the instruction memory 114. The instruction memory 114 is, e.g., a first-in first-out memory, and stores the sequence of the test data blocks indicated by the instruction information. It is preferable that the instruction memory 114 stores the instruction information showing all sequence of the test data blocks to be stored on the pattern cache memory 82 and the sequence cache memory 92 in order to generate the test pattern before the pattern generator 50 begins to generate the test pattern. Moreover, the instruction memory 114 may receive the next instruction information from the tester control unit 150 whenever an available space occurs in memory space.

The memory control unit 70 sequentially reads information showing the test data blocks to be read from the instruction memory 114, and reads the test data blocks from the main memory 60 based on the information. Then, the memory control unit 70 stores the pattern data block on the pattern cache memory 82 and the sequence data block on the sequence cache memory 92 in the read test data blocks. It is preferable that the pattern cache memory 82 and the sequence cache memory 92 have a predetermined plurality of storage areas. The main memory 60 stores a plurality of test data blocks having the magnitude capable of being stored on each storage area in the pattern cache memory 82 and the sequence cache memory 92.

The sequence generating device 94 sequentially supplies the addresses of the pattern data blocks stored on the pattern cache memory 82 to the pattern generating device 84 based on the sequence data blocks stored on the sequence cache memory 92. The pattern generation device 84 generates the test pattern based on the pattern data block and the sequence data block. In other words, the sequence generating device 94 sequentially instructs the pattern generating device 84 on the addresses of the pattern data blocks to be output as the test pattern based on the sequence data blocks, and the pattern generating device 84 takes out the data in the pattern data blocks from the pattern cache memory 82 according to the instructed addresses and sequentially outputs the data.

For example, the sequence data block is a program including a jump instruction, a loop instruction, etc. The sequence generating device 94 supplies address sequence that is made by developing the addresses of the pattern data blocks corresponding to each instruction to the pattern generating device 84 based on the program. The pattern generation device 84 sequentially selects and outputs the data in the pattern data blocks stored on the pattern cache memory 82 based on the address sequence.

The memory control unit 70 reads the data blocks to be secondly stored on the pattern cache memory 82 and the sequence cache memory 92 from the main memory 60 while the pattern generating unit 80 is developing one pattern data block. The memory control unit 70 sequentially stores the test data blocks according to the instruction information on the cache memories 82 and 92 until an available space is no longer present in the plurality of areas in the pattern cache memory 82 and the sequence cache memory 92.

Moreover, the memory control unit 70 may previously store the plurality of pattern data blocks and the plurality of sequence data blocks on the pattern cache memory 82 and the sequence cache memory 92 based on the instruction information before beginning to generate the test pattern.

Moreover, the memory control unit 70 controls which storage area in the cache memories 82 and 92 the test data blocks to be stored on the cache memories 82 and 92 are stored on. For example, the memory control unit 70 may store the test data block, which is repeatedly used among the test data blocks, on a predetermined storage area.

Moreover, the memory control unit 70 reads the test data block to be secondly stored on the cache memories 82 and 92 from the main memory 60 based on the instruction information and newly stores the test data block on the storage area on which the test data block no longer required is stored when the test data block stored on either of the plurality of storage areas in the cache memories 82 and 92 is no longer required. For example, when the pattern generator 50 finishes generating the test pattern using the test data block not to be repeatedly used, the memory control unit 70 writes the new test data block on the storage area on which the test data block is stored. Here, the test data block is an unnecessary test data block.

Moreover, when the used test data block is a test data block to be repeatedly used, it is preferable for the cache memories 82 and 92 to hold the test data block. For example, when the test data block stored on the predetermined storage area is used, the cache memories 82 and 92 may hold the test data block. Moreover, the memory control unit 70 may instruct the cache memories 82 and 92 on the test data block to be held, or the cache memories 82 and 92 may hold the test data block based on information to indicate that the test data block should be held when the information is added to the test data block. When the test data block is held, the memory control unit 70 does not read a new test data block from the main memory 60. Moreover, the sequence generating device 94 may instruct the memory control unit 70 on a storage area on which a new test data block should be written.

When the sequence generating device 94 detects a jump instruction showing a jump to other pattern data block during developing one pattern data block, it is necessary for the pattern generating device 84 to read the other pattern data block from the pattern cache memory 82. According to the pattern generator 50 of this example, since the memory control unit 70 sequentially stores the test data blocks on the cache memories 82 and 92 with respect to vacant areas in the cache memories 82 and 92, it is possible to reduce waiting time of reading and writing of the test data blocks and to efficiently generate the test pattern. Moreover, the tester control unit 150 has a data adding unit 118 that adds the test data blocks to the main memory 60 in this example.

According to the pattern generator 50 of this example, since the test data blocks are sequentially stored according to the instruction information, it is possible to continuously develop the test data and to efficiently generate the test pattern. Moreover, it is possible to manage the test data for each test item and to easily perform an addition, an amendment, and a deletion of the test data blocks.

Figure 4:
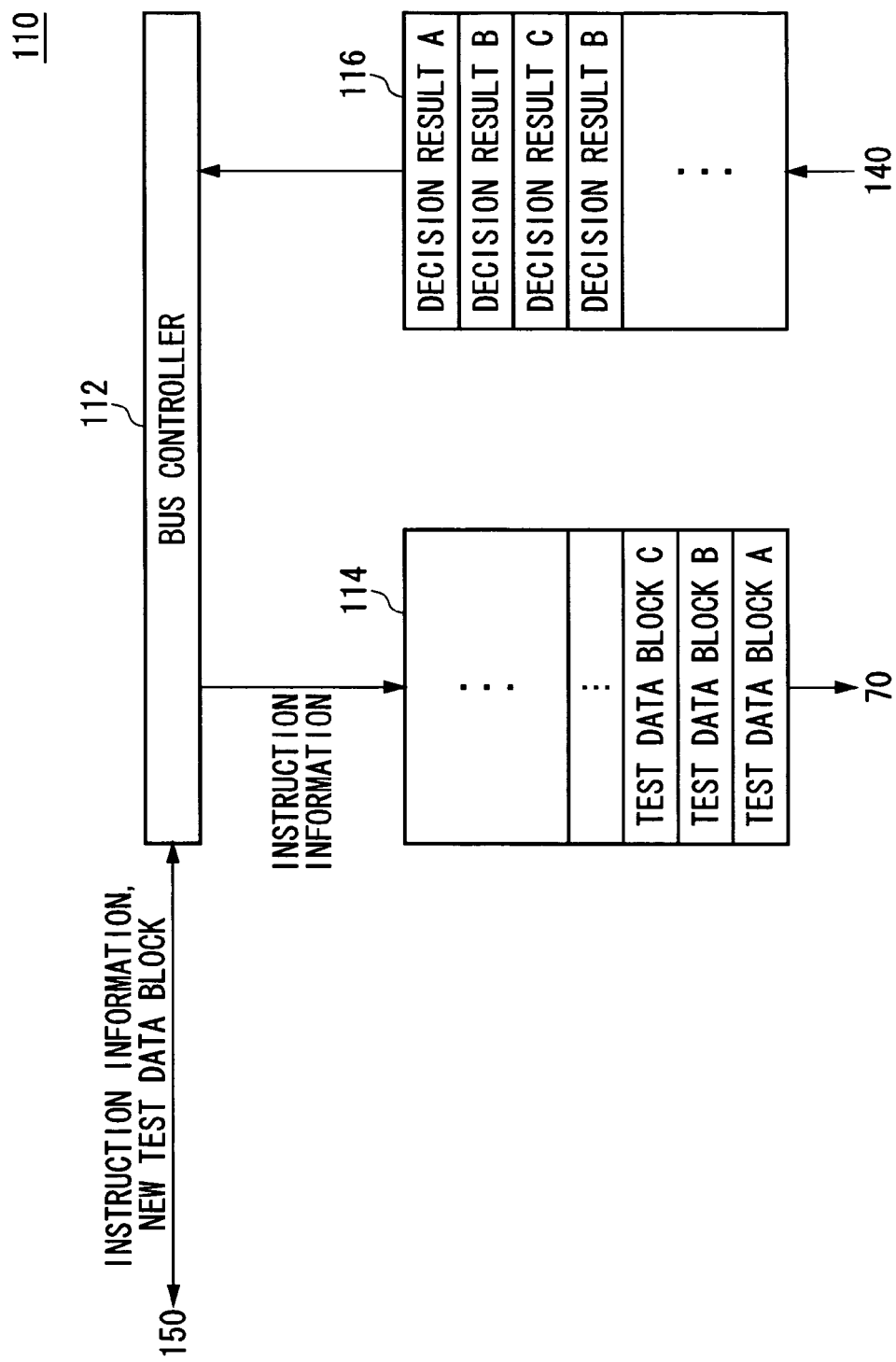
FIG. 4 shows a view explaining an operation of the bus control unit.

FIG. 4 is a view explaining an operation of the bus control unit 110. The data adding unit 118 (see FIG. 3) of the tester control unit 150 transfers a necessary test data block to the bus controller 112 before testing the electronic device 200.

The bus controller 112 stores the received test data block on the main memory 60 (see FIG. 3) via the memory control unit 70.

Moreover, the tester control unit 150 supplies instruction information for generating the test pattern to be supplied to the electronic device 200 to the bus controller 112 before testing the electronic device 200. The bus controller 112 stores the instruction information on the instruction memory 114. The instruction memory 114 is a FIFO memory, and stores the sequence of the test data blocks indicated by the instruction information. For example, the instruction memory 114 may store a head address and an end address of the test data block to be read from the main memory 60 in sequence.

Moreover, when generating the next test pattern, the data adding unit 118 may transfer a necessary test data block to the bus controller 112 when the necessary test data block is not stored on the main memory 60. The bus controller 112 stores the received test data block on the main memory 60 via the memory control unit 70. In this case, the bus control unit 110 may store other test data blocks on the main memory 60 while the pattern generator 50 is generating the test pattern. Moreover, although the tester control unit 150 has supplied new instruction information to the bus control unit 110, the data adding unit 118 may not necessarily transfer a new test data block. In this case, the bus control unit 110 may request the tester control unit 150 to transfer the test data block based on the instruction information.

Moreover, the decision result memory 116 may receive the decision result output from the deciding unit 20 from the capture control unit 140 for each test data block. The decision result memory 116 may store the decision result in association with the test data block. The tester control unit 150 sequentially takes out the decision results from the decision result memory 116 via the bus controller 112 and performs the related processes.

According to the testing device 100 of this example, since the tester control unit 150 and the pattern generator 50 are independently processed, it is possible to efficiently test the electronic device.

FIG. 5 is a view exemplary showing the test pattern generated from the pattern generator 50. As described above, the pattern generator 50 reads the test data blocks from the main memory 60 to generate the test patterns as shown in FIG. 5. The main memory 60 may store main test data blocks and sub test data blocks.

As shown in FIG. 5, the pattern generator 50 reuses the main test data blocks to generate the test patterns, or may generate a plurality of test patterns sharing the sub test data blocks. Moreover, the pattern generator 50 may interchange the sub test data blocks for each test pattern. In these cases, it is preferable that the cache memories 82 and 92 hold the reused test data blocks. According to the pattern generator 50 of this example, it is possible to easily generate these test patterns.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to efficiently generate the test patterns. Moreover, it is possible to efficiently test the electronic device.

What is claimed is:

1. A pattern generator that generates a test pattern for testing an electronic device using test data previously supplied, comprising:
    a cache memory comprised of:
        a pattern cache memory that stores a plurality of pattern data blocks, and
        a sequence cache memory that stores a plurality of sequence data blocks;
    a main memory operable to store a plurality of test data blocks of which each block is the test data of the magnitude capable of being stored on said cache memory, wherein the test data block is comprised of pattern data blocks and sequence data blocks;
    an instruction memory operable to store instruction information showing sequence in which the plurality of test data blocks should be stored on said cache memory, wherein
    the pattern generator sequentially outputs the test data blocks stored on said cache memory as the test pattern; and
    a memory control unit operable to read the test data blocks to be secondly stored on the pattern cache memory from the main memory while the pattern generating unit is developing one test data block, and to sequentially store the test data blocks on the cache memory with respect to vacant areas in the cache memory.

2. The pattern generator as claimed in claim 1, wherein said instruction memory stores the instruction information showing all sequence of the test data blocks to be stored on said cache memory in order to generate the test pattern before beginning to generate the test pattern.

3. The pattern generator as claimed in claim 1, wherein said cache memory has a predetermined plurality of storage areas, and
    the pattern generator further comprises a memory control unit operable to control which storage area in said cache memory the test data block to be stored on said cache memory is stored on.

4. The pattern generator as claimed in claim 3, wherein the test data block is the magnitude capable of being stored on each of the storage areas.

5. The pattern generator as claimed in claim 3, wherein said memory control unit reads the test data block to be secondly stored on said cache memory from said main memory based on the instruction information and
    newly stores the test data block on the storage area on which the test data block no longer required is stored when the test data block stored on either of the plurality of storage areas in said cache memory is no longer required.

6. The pattern generator as claimed in claim 5, wherein the test pattern comprises:
    a pattern data showing a signal to be supplied to the electronic device; and
    a sequence data showing sequence in which the test data pattern should be supplied to the electronic device, wherein
    the pattern cache memory stores the pattern data in pattern data blocks; and
    sequence cache memory stores the sequence data in sequence data blocks.

7. The pattern generator as claimed in claim 6, wherein the pattern generator further comprises:
    a pattern generating unit operable to sequentially take out the pattern data from said cache memory; and a sequencer operable to sequentially take out the sequence data from said cache memory, and said pattern generating unit generates the test pattern based on the pattern data taken out and the sequence data taken out by said sequencer.

8. A testing device that tests an electronic device, comprising:

a pattern generator operable to generate a test pattern for testing the electronic device using test data previously supplied;

a waveform shaper operable to shape the test pattern; and a deciding unit operable to decide the quality of the electronic device based on an output signal output from the electronic device according to the test pattern, wherein said pattern generator comprises:

a cache memory comprised of:
  a pattern cache memory that stores a plurality of pattern data blocks, and
  a sequence cache memory that stores a plurality of sequence data blocks;

a main memory that stores a plurality of test data blocks of which each block is the test data of the magnitude capable of being stored on the cache memory;

an instruction memory that stores instruction information showing sequence in which the plurality of test data blocks should be stored on the cache memory, and said pattern generator sequentially outputs the test data blocks stored on the cache memory as the test pattern; and a memory control unit operable to read the test data blocks to be secondly stored on the pattern cache memory from the main memory while the pattern generating unit is developing one test data block, and to sequentially store the test data blocks on the cache memory with respect to vacant areas in the cache memory.

9. The testing device as claimed in claim 8, wherein said deciding unit decides the quality of the electronic device in correspondence with each of the test data blocks, and said pattern generator further comprises a decision result memory that stores a decision result from said deciding unit in association with the test data block.

10. The testing device as claimed in claim 8, wherein the testing device further comprises a data adding unit operable to write the new test data block on the main memory, and said data adding unit writes the test data block indicated by the instruction information on the main memory when the test data block not stored on the main memory is indicated by the instruction information.

* * * * *

UNITED STATES PATENT AND TRADEMARK OFFICE
CERTIFICATE OF CORRECTION

PATENT NO.       : 7,363,566 B2
APPLICATION NO.  : 11/136075
DATED            : April 22, 2008
INVENTOR(S)      : Masaru Goishi It is certified that error appears in the above-identified patent and that said Letters Patent is hereby corrected as shown below:

In the Claims:

Column 8, line 61, before the first occurrence of the word "sequence" the word "the" is erroneously missing.

Signed and Sealed this

Nineteenth Day of August, 2008

JON W. DUDAS
*Director of the United States Patent and Trademark Office*